(12) United States Patent
Bates et al.

(10) Patent No.: US 9,015,552 B2
(45) Date of Patent: *Apr. 21, 2015

(54) DATA DEDUPLICATION USING CRC-SEED DIFFERENTIATION BETWEEN DATA AND STUBS

(71) Applicant: International Business Machines Corporation, Armonk, NY (US)

(72) Inventors: Allen K. Bates, Tucson, AZ (US); Nils Haustein, Soergenloch (DE); Craig A. Klein, Redington Beach, FL (US); Frank Krick, Ockenheim (DE); Ulf Troppens, Mainz (DE); Daniel J. Winarski, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 46 days.

This patent is subject to a terminal disclaimer.

(21) Appl. No.: 13/894,016

(22) Filed: May 14, 2013

(65) Prior Publication Data
US 2013/0262422 A1 Oct. 3, 2013

Related U.S. Application Data

(63) Continuation of application No. 12/730,400, filed on Mar. 24, 2010, now Pat. No. 8,453,031.

(51) Int. Cl.
*H03M 13/00* (2006.01)
*G06F 13/00* (2006.01)
*G06F 17/00* (2006.01)
*G06F 17/30* (2006.01)
*G06F 11/10* (2006.01)
*H03M 13/09* (2006.01)

(52) U.S. Cl.
CPC ...... *G06F 17/30303* (2013.01); *G06F 11/1004* (2013.01); *H03M 13/09* (2013.01)

(58) Field of Classification Search
CPC ......... G06F 17/30303; G06F 11/1004; H03M 13/09
USPC ............ 714/758, 799; 707/692; 711/161, 162
See application file for complete search history.

(56) References Cited

U.S. PATENT DOCUMENTS

| 7,200,604 B2 | 4/2007 | Forman et al. |
| 7,225,387 B2 | 5/2007 | Lin et al. |
| 7,533,291 B2 * | 5/2009 | Lin ................................ 714/6.3 |

(Continued)

OTHER PUBLICATIONS

Thwel, T.T.; Thein, N.L.;, "An Efficient Indexing Mechanism for Data Deduplication," Current Trends in Information Technology (CTIT), 2009 International Conference on the, vol., no., pp. 1-5, Dec. 15-16, 2009.*

(Continued)

*Primary Examiner* — Cynthia Britt
(74) *Attorney, Agent, or Firm* — Griffiths & Seaton PLLC

(57) ABSTRACT

Various embodiments for differentiating between data and stubs pointing to a parent copy of deduplicated data are provided. Undeduplicated data is stored with a checksum of an initial value as a first cyclic redundancy check (CRC) seed. A stub pointing to the parent copy of the deduplicated data is stored with an additional checksum of a differing, additional initial value as a second CRC seed.

24 Claims, 3 Drawing Sheets

(56) References Cited

U.S. PATENT DOCUMENTS

| | | | |
|---|---|---|---|
| 7,962,452 B2* | 6/2011 | Anglin | 707/645 |
| 8,121,993 B2 | 2/2012 | Blount et al. | |
| 2004/0123221 A1 | 6/2004 | Huffman et al. | |
| 2005/0071391 A1 | 3/2005 | Fuerderer et al. | |
| 2006/0067365 A1 | 3/2006 | Venkataramana et al. | |
| 2008/0005141 A1 | 1/2008 | Zheng et al. | |
| 2008/0013830 A1 | 1/2008 | Patterson et al. | |
| 2008/0098083 A1 | 4/2008 | Shergill et al. | |
| 2008/0155192 A1 | 6/2008 | Iitsuka | |
| 2008/0263109 A1 | 10/2008 | Patterson | |
| 2008/0288482 A1 | 11/2008 | Chaudhuri et al. | |
| 2008/0294696 A1 | 11/2008 | Frandzel | |
| 2009/0271454 A1* | 10/2009 | Anglin et al. | 707/204 |
| 2011/0055471 A1 | 3/2011 | Thatcher et al. | |
| 2011/0072291 A1 | 3/2011 | Murase | |
| 2011/0252070 A1 | 10/2011 | Khosrowpour et al. | |

OTHER PUBLICATIONS

Meister, D.; Brinkmann, A.;, "dedupv1: Improving deduplication throughput using solid state drives (SSD)," Mass Storage Systems and Technologies (MSST), 2010 IEEE 26th Symposium on, vol., no., pp. 1-6, May 3-7, 2010.*

Yang et al.; "Next Steps in Near-Duplicate Detection for eRulemaking".

"Understanding the HP Data Deduplication Strategy".

Wei, et al., "MAD2: A scalable high-throughout exact deduplication approach for network backup services", pp. 1-14, 3-7, 2010 IEEE 26th Symposium on Mass Storage Systems and Technologies (MSST), May 2010.

Zhang et al., "2010 IEEE International Conference on Exploiting Data Deduplication to Accelerate Live Virtual Machine Migration", pp. 88-96, 20-24, Sep. 2010, Cluster Computing (CLUSTER).

* cited by examiner

DATA DEDUPLICATION USING CRC-SEED DIFFERENTIATION BETWEEN DATA AND STUBS

CROSS-REFERENCE TO RELATED APPLICATIONS

This application is a Continuation of U.S. patent application Ser. No. 12/730,400, filed on Mar. 24, 2010, the contents of which are incorporated herein by reference.

BACKGROUND OF THE INVENTION

1. Field of the Invention

The present invention relates in general to computers, and more particularly to apparatus, method and computer program product embodiments for replication of deduplicated data in a computing storage environment.

2. Description of the Related Art

Data deduplication refers to the reduction and/or elimination of redundant data. In a data deduplication process, duplicate copies of data are reduced or eliminated, leaving a minimal amount of redundant copies, or a single copy of the data, respectively. Using deduplication processes provides a variety of benefits, such as reduction of required storage capacity and increased network bandwidth. Due to these and other benefits, deduplication has emerged in recent years as a highly important technological field in computing storage systems. Challenges to providing deduplication functionality include aspects such as efficiently finding duplicated data patterns in typically large storage repositories, and storing the data patterns in a deduplicated storage-efficient form.

Data deduplication offers the promise of a significant reduction of stored data by identifying repetitive storage of identical data. Once duplicate data is identified by deduplication algorithms (such as various Hash algorithms), the duplicate data is replaced by a stub that points to a parent copy of the data, thus greatly reducing the amount of data stored.

SUMMARY OF THE INVENTION

Since, as one of ordinary skill in the art will appreciate, a deduplication implementation may result in a large number of stubs in relation to actual data, it becomes important to establish a mechanism whereby the data stored pursuant to such deduplication mechanisms may be verified. To this extent, a need exists for mechanism to distinguish between such actual data and stub information when performing such verification, in order to improve overall accuracy and performance.

Accordingly, and in view of the foregoing, various embodiments for differentiating between data and stubs pointing to a parent copy of deduplicated data are provided. In one embodiment, by way of example only, a method of differentiation is provided. Undeduplicated data is stored with a checksum of an initial value as a first cyclic redundancy check (CRC) seed. A stub pointing to the parent copy of the deduplicated data is stored with an additional checksum of a differing, additional initial value as a second CRC seed.

In addition to the foregoing exemplary method embodiment, other exemplary system and computer product embodiments are provided and supply related advantages.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict embodiments of the invention and are not therefore to be considered to be limiting of its scope, the invention will be described and explained with additional specificity and detail through the use of the accompanying drawings, in which.

DETAILED DESCRIPTION OF THE DRAWINGS

Figure 1:
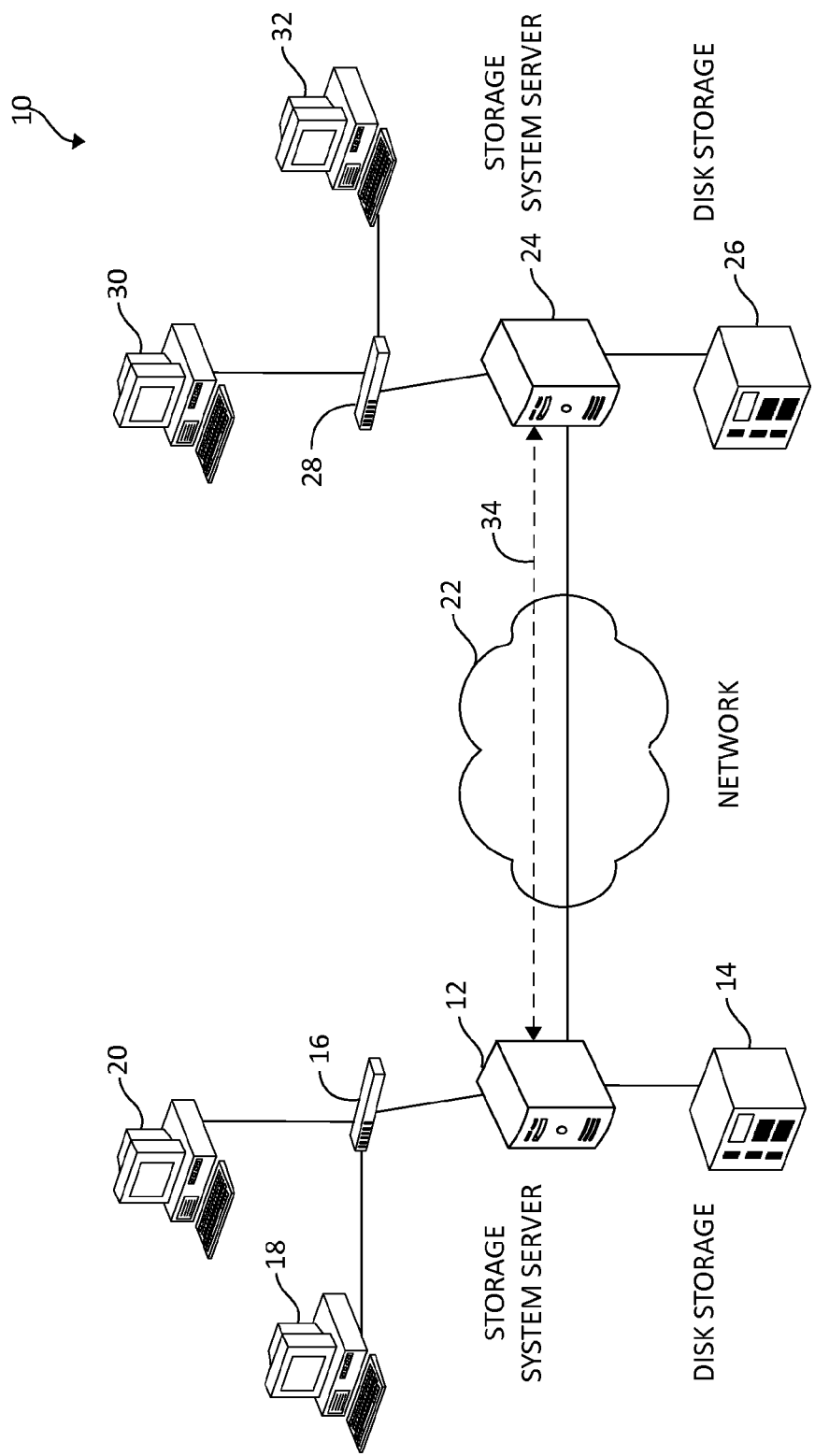
FIG. 1 illustrates an exemplary computing environment in which aspects of the present invention may be implemented.

Turning now to FIG. 1, exemplary architecture 10 of data storage systems (e.g., virtual tape systems) in a computing environment is depicted. Architecture 10 provides storage services to local hosts 18 and 20, and replicate data to remote data storage systems as shown. A local storage system server 12 in communication with a storage device 14 is connected to local hosts 18 and 20 over a network including components such as Fibre channel switch 16. Fibre channel switch 16 is capable, for example, of executing commands (such as small computer systems interface (SCSI) commands) for tape devices. The skilled artisan will appreciate that architecture 10 may include a variety of storage components. For example, storage devices 14 may include conventional hard disk drive (HDD) devices, or may include solid state drive (SSD) devices.

Local storage system server 12 is connected over network 22 to a remote storage system server 24. Remote server 24 communicates with a locally connected disk storage device 26, and with locally connected hosts 30 and 32 via another network and network component 28 such as Fibre channel switch 28. Network 22 may include a variety of network topologies, such as a wide area network (WAN), a local area network (LAN), a storage area network (SAN), network attached storage (NAS), scaled-out network attached storage (SoNAS), and other configurations. Similarly, switches 16 and 28 may include other types of network devices. In an alternate embodiment, switches 16 and 28 are Ethernet switches, Fibre-Channel over Ethernet (FCoE) switches, or Infiniband Switches.

Architecture 10, as previously described, provides local storage services to local hosts, and provides replicate data to the remote data storage systems (as denoted by data replication functionality using arrow 34). As will be described, various embodiments of the present invention and claimed subject matter may be implemented on architectures such as architecture 10. For example, in one embodiment, the disk storage device 14 may be part of a deduplicated storage system, storing deduplicated data entities. The deduplicated data entities may then undergo a data replication process 34 whereby the deduplicated data entities are replicated on the remote disk storage device 26. One of ordinary skill in the art will appreciate that other system architectures may implement aspects of the present invention.

The illustrated embodiments described, following, provide a novel approach for facilitating data verification in deduplication settings by differentiating between data and stubs pointing to the parent copy of deduplicated data. In one example, the mechanisms of the illustrated embodiments may be directed to deduplication storage systems that partition the stored deduplicated data into variable sized blocks and achieve storage efficiency, given prior identification of recurring data patterns (via any appropriate method), by repeated referencing of the deduplicated data blocks that contain portions of such recurring data patterns. Here again, however, other deduplication settings may incorporate various aspects of the present invention.

As will be seen throughout the following, the mechanisms of the present invention utilize differing cyclical redundancy check (CRC) seeds to assist in differentiating between actual data and stubs. One CRC seed is used in conjunction with the actual data, and another, numerically different CRC seed is used in conjunction with stubs. As one of ordinary skill in the art will appreciate, CRCs incorporate a method for error checking that detects errors in data segments, such as blocks. Unlike parity checks, the CRC can detect multiple data errors within the same data segment, and thus derive an error rate. CRC seeds are obtained by using an algorithm to generate a value (generally numerical) that is based on the underlying data segment. By using a separate CRC seed for actual data, and an additional CRC for stubs, both data and stubs may be later verified to determine if they are actual data or stubs. The mathematics behind the cyclical redundancy check is that the CRC polynomial creates a checksum and the initial value of that checksum is the CRC seed. Typically, this CRC seed is zero, 0000 (hex). However, the final result of the checksum may be offset by a nonzero CRC seed, such as FFFF (hex), which does not change the mathematical algorithm itself but does change the result of that mathematical algorithm. By using one CRC seed in conjunction with the actual data, and another, numerically different CRC seed in conjunction with stubs, data and stubs can be distinguished from one another based on the checksum stored with the data and stub and the calculated checksum given the choice of CRC seed.

Figure 2:
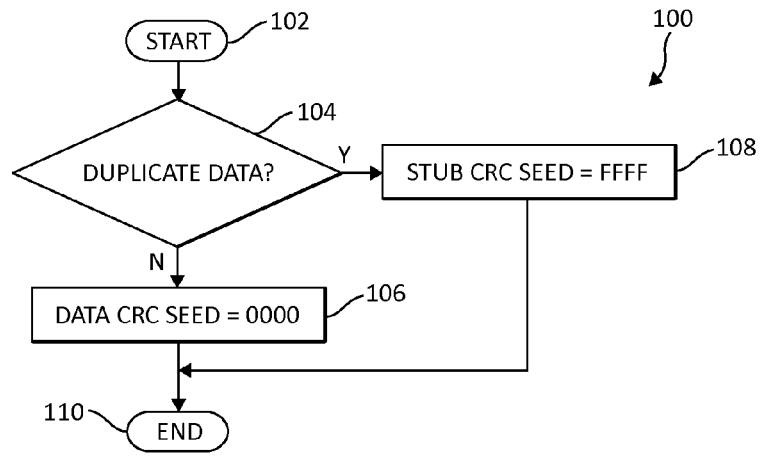
FIG. 2 illustrates an exemplary method describing a write process, in which various aspects of the present invention may be implemented.

Turning now to FIG. 2, an exemplary write process 100 incorporating aspects of the present invention is shown. Write process 100 begins at step 102 with a write operation of the data in question to storage. In step 104, following, a check is made whether the data is duplicate, via a Hash algorithm, for example. If the data is not duplicate, the data is stored in the storage (cache, tape, optical, hard disk, or flash memory) using a CRC of 0000 in step 106. However, if the data is duplicate, then only a stub (pointer) is stored and the CRC of that stub is a numerically different number, such as FFFF (hexadecimal) in step 108. The write process ends in step 110. In an alternate embodiment, the stub (pointer) is the digest (output) of the aforementioned Hash algorithm.

Figure 3:
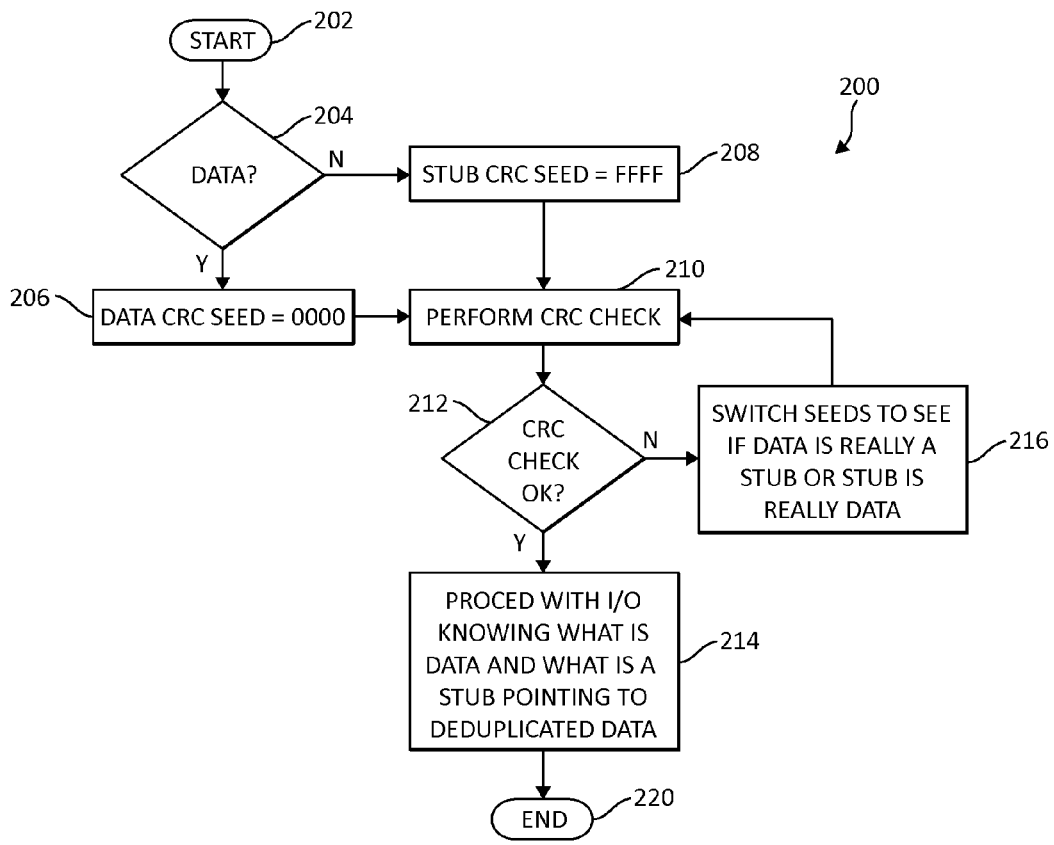
FIG. 3 illustrates an exemplary method describing a read process, again in which various aspects of the present invention may be implemented.

FIG. 3, following, depicts an exemplary read process 200, again in which various aspects of the present invention may be incorporated. Read process 200 begins at step 202 as shown. If in step 204 the information being read is assumed to be data, the CRC seed is assumed to be 0000 (hex) in step 206 and a CRC check of that data is made in step 210. However, if the information being read is assumed to be a stub, the CRC seed is assumed to be FFFF (hex) in step 208, and a check of that stub is made in step 210. If in step 212, the CRC check is affirmative, then the process continues in step 214, now with an understanding of what are data (undeduplicated data) and what is a stub pointing to the parent copy of deduplicated data. The process ends in step 220.

Returning to step 212, if the CRC check is negative, the process continues to step 216 where the CRC seeds are interchanged and the CRC check is performed again. Inventive step 216 makes the effort to identify data as data and stubs as stubs, as only one CRC seed is associated with data and a numerically different CRC seed is associated with stubs. This way, the IO process differentiates between data and stubs by changing the CRC seed but not the CRC polynomial itself. Returning again to step 212, if the re-performed CRC check on the interchanged CRC is affirmative, the process continues to step 214 as previously described, and the process ends at step 220.

In an alternative embodiment, a different CRC seed may be used for each type of deduplication algorithm (e.g., Hash algorithm) used in the deduplication process. For example, pointers associated with the Hash algorithm SHA-256 may be assigned a CRC seed of FFFF (hex), while stubs associated with the Hash algorithm SHA-512 may be assigned a different CRC seed of EEEE (hex), and stubs associated with the Hash algorithm MD5 may be assigned a CRC seed of DDDD (hex). In this manner, more than one HASH algorithm may be used in a storage system, and the stubs (pointers) could be correctly associated with the appropriate Hash algorithm. In still another alternative embodiment, a different CRC polynomial may be used for data and stubs.

The ability to distinguish data from its associated metadata is just as important as being able to distinguish data from its associated stub, as previously described. Accordingly, an additional adaptation to the foregoing exemplary embodiments is now presented. Pursuant to this adaptation, data is assigned a CRC seed of 0000 (hex) and the metadata associated with that data is assigned a different CRC seed, such as 9999 (hex). Distinguishing data from metadata is important, for example, for the new Linear Tape Open (LTO) Generation-5 partitioned tape cartridge, where metadata is stored in one partition of the LTO tape cartridge and data in the other partition of that LTO tape cartridge. This metadata can be associated with LTFS (Long Term File System), a recent product introduced by IBM®, which allows a tape cartridge to mimic a hard disk drive. An example of the use of LTFS would be the long-term archival storage of digital motion pictures from the entertainment industry, where the metadata would be used to point to actual scenes in the digital motion picture.

In other settings, this metadata can also be associated with DICOM (Digital Imaging and Communications in Medicine), where DICOM metadata is stored in one partition of the LTO tape cartridge and the medical images themselves stored in the other partition of the LTO tape cartridge. Examples of medical imaging include the storage of Magnetic Resonance Imaging (MRI), Computerized Axial Tomography (CAT) scans, echocardiogram video, x-ray images, and the like, where metadata is used to point to actual medical imagery. For both the LTFS and DICOM applications, as well as other possible implementations, the metadata of the desired data may be accessed first using a CRC seed reserved for metadata so that the host can be assured that metadata is being accessed over and above the location of the metadata in the partitioned LTO tape cartridge. Once the metadata is verified to be metadata via a CRC check as shown in FIG. 3, then the data associated with this metadata can be accessed from the data partition of LTO tape cartridge by using a CRC seed reserved for data.

Here, as before, various embodiments may feature the inclusion of differing CRC seeds corresponding to various types of metadata. Metadata corresponding to certain images, for example, may be assigned a first CRC seed, while metadata corresponding to video may be assigned an additional CRC seed. In one embodiment, CRC seeds differ between the types of video and images as well as the corresponding metadata, to further aide the differentiation between the medical data and the metadata identifying that medical data. For example, MRI metadata has a different CRC seed 1100 (hex) from the CRC seed used for MRI images 0011 (hex), CAT scan metadata has a different CRC seed 2200 (hex) from the CRC seed used for CAT scan images 0022 (hex), echocardiogram metadata has a different CRC seed 3300 (hex) from the CRC seed used for echocardiogram video 0033 (hex), and x-ray image metadata has a different CRC seed 4400 (hex) from the CRC seed used for x-ray image 0044 (hex).

Figure 4:
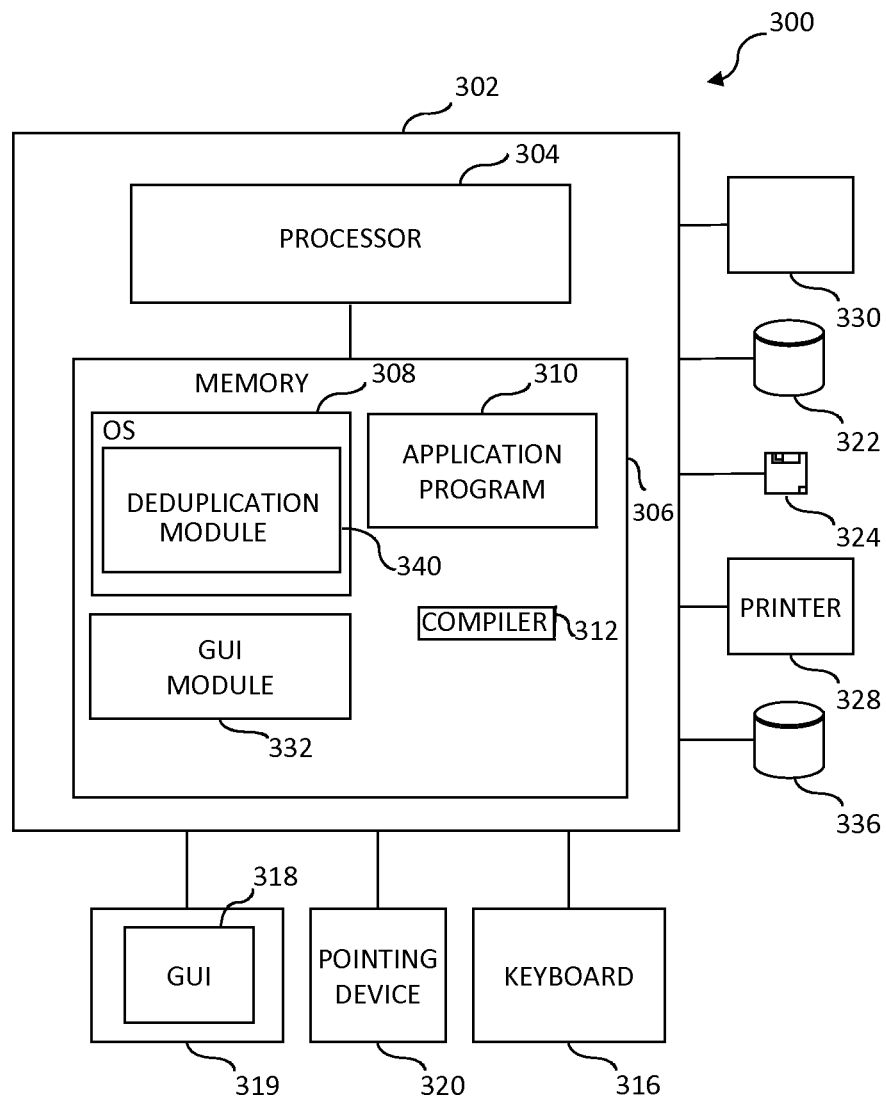
FIG. 4 illustrates an exemplary computing device including a processor device in a computing environment such as the computing environment shown in FIG. 1.

FIG. 4 hereafter provides an example of a portion of the computer environment 10 depicted in FIG. 1 in which the mechanisms of the foregoing embodiments may be implemented. It should be appreciated, however, that FIG. 4 is only exemplary and is not intended to state or imply any limitation as to the particular architectures in which the exemplary aspects of the various embodiments may be implemented. Many modifications to the architecture depicted in FIG. 4 may be made without departing from the scope and spirit of the following description and claimed subject matter.

FIG. 4 illustrates a portion 300 of an exemplary computer environment that may be used to implement embodiments of the present invention. A computer 302 comprises a processor 304 and a memory 306, such as random access memory (RAM). In one embodiment, storage system server 12 (FIG. 1) may include components similar to those shown in computer 302. The computer 302 is operatively coupled to a display 319, which presents images such as windows to the user on a graphical user interface 318. The computer 302 may be coupled to other devices, such as a keyboard 316, a mouse device 320, a printer 328, etc. Of course, those skilled in the art will recognize that any combination of the above components, or any number of different components, peripherals, and other devices, may be used with the computer 302.

Generally, the computer 302 operates under control of an operating system (OS) 308 (e.g. z/OS, OS/2, LINUX, UNIX, AIX, WINDOWS, MAC OS) stored in the memory 306, and interfaces with the user to accept inputs and commands and to present results, for example through a graphical user interface (GUI) module 332. In one embodiment of the present invention, the OS 308 facilitates the backup mechanisms. Although the GUI module 332 is depicted as a separate module, the instructions performing the GUI functions can be resident or distributed in the operating system 308, the application program 310, or implemented with special purpose memory and processors. OS 308 includes a deduplication module 340 which may be adapted for carrying out various processes and mechanisms in the exemplary embodiments previously described. For example, the deduplication module 340 may be adapted for performing the aforementioned CRC checks, or storing the actual data or stubs along with particular CRCs, again as previously described.

Deduplication module 340 may be implemented in hardware, firmware, or a combination of hardware and firmware. In one embodiment, the deduplication module 340 may be embodied as an application specific integrated circuit (ASIC). As the skilled artisan will appreciate, functionality associated with the deduplication module 340 may also be embodied, along with the functionality associated with the processor 304, memory 306, and other components of computer 302, in a specialized ASIC known as a system on chip (SoC). Further, the functionality associated with the deduplication module (or again, other components of the computer 302) may be implemented as a field programmable gate array (FPGA).

As depicted in FIG. 4, the computer 302 includes a compiler 312 that allows an application program 310 written in a programming language such as COBOL, PL/1, C, C++, JAVA, ADA, BASIC, VISUAL BASIC or any other programming language to be translated into code that is readable by the processor 304. After completion, the computer program 310 accesses and manipulates data stored in the memory 306 of the computer 302 using the relationships and logic that was generated using the compiler 312. The computer 302 also optionally comprises an external data communication device 330 such as a modem, satellite link, Ethernet card, wireless link or other device for communicating with other computers, e.g. via the Internet or other network.

Data storage device 322 is a direct access storage device (DASD) 322, including one or more primary volumes holding a number of datasets. DASD 322 may include a number of storage media, such as hard disk drives (HDDs), tapes, and the like. Data storage device 336 may also include a number of storage media in similar fashion to device 322. The device 336 may be designated as a backup device 336 for holding backup versions of the number of datasets primarily stored on the device 322. As one of ordinary skill in the art will appreciate, devices 322 and 336 need not be located on the same machine. Devices 322 may be located in geographically different regions, and connected by a network link such as Ethernet. Devices 322 and 336 may include one or more volumes, with a corresponding volume table of contents (VTOC) for each volume.

In one embodiment, instructions implementing the operating system 308, the computer program 310, and the compiler 312 are tangibly embodied in a computer-readable medium, e.g., data storage device 320, which may include one or more fixed or removable data storage devices 324, such as a zip drive, floppy disk, hard drive, compact disc (CD), digital versatile disk (DVD), blu-ray disc (BD), digital tape, flash memory card, solid state drive, etc., which are generically represented as the storage device 324. Further, the operating system 308 and the computer program 310 comprise instructions which, when read and executed by the computer 302, cause the computer 302 to perform the steps necessary to implement and/or use the present invention. For example, the computer program 310 may comprise instructions for implementing the grid set manager, grid manager and repository manager previously described. Computer program 310 and/or operating system 308 instructions may also be tangibly embodied in the memory 306 and/or transmitted through or accessed by the data communication device 330. As such, the terms "article of manufacture," "program storage device" and "computer program product" as may be used herein are intended to encompass a computer program accessible and/or operable from any computer readable device or media.

Embodiments of the present invention may include one or more associated software application programs 310 that include, for example, functions for managing a distributed computer system comprising a network of computing devices, such as a storage area network (SAN). Accordingly, processor 304 may comprise a storage management processor (SMP). The program 310 may operate within a single computer 302 or as part of a distributed computer system comprising a network of computing devices. The network may encompass one or more computers connected via a local area network and/or Internet connection (which may be public or secure, e.g. through a virtual private network (VPN) connection), or via a fibre channel SAN or other known network types as will be understood by those skilled in the art. (Note that a fibre channel SAN is typically used only for computers to communicate with storage systems, and not with each other.)

As will be appreciated by one of ordinary skill in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a compact disc (CD), a digital versatile disk (DVD), a blu-ray disc (BD), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Program code embodied on a computer readable medium may be transmitted using any appropriate medium, including but not limited to wireless, wired, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention have been described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the above figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While one or more embodiments of the present invention have been illustrated in detail, the skilled artisan will appreciate that modifications and adaptations to those embodiments may be made without departing from the scope of the present invention as set forth in the following claims.

What is claimed is:

1. A method for differentiating between data and stubs pointing to a parent copy of deduplicated data using a processor device, comprising:
    storing undeduplicated data with a checksum of an initial value as a first cyclic redundancy check (CRC) seed; and
    storing a stub pointing to the parent copy of the deduplicated data with an additional checksum of a differing, additional initial value as a second CRC seed.

2. The method of claim 1, further including, pursuant to conducting a subsequent input/output (I/O) operation, utilizing the first and second CRC seeds to differentiate between the undeduplicated data and the stub by comparing the stored checksum and additional checksum with a calculated checksum.

3. The method of claim 2, further including performing, on data unknown to be deduplicated or undeduplicated, a CRC check using one of the first and second CRC seeds to obtain the calculated checksum.

4. The method of claim 3, further including, subsequent to performing the CRC check, if the calculated checksum matches a predetermined assumption of the unknown data, proceeding with the (I/O) operation.

5. The method of claim 4, further including, subsequent to performing the CRC check, if the calculated checksum does not match the predetermined assumption of the unknown data, performing an additional CRC check using another one of the first and second CRC seeds to obtain an additional calculated checksum.

6. The method of claim 5, further including, subsequent to performing the additional CRC check, if the additional calculated checksum matches the predetermined assumption of the unknown data, proceeding with the I/O operation.

7. The method of claim 1, wherein storing the undeduplicated data with the first CRC seed, and storing the stub pointing to the parent copy of the deduplicated data with the second CRC seed further includes storing the first and second CRC seeds with one of differing numerical values and differing CRC polynomials.

8. The method of claim 1, wherein storing the stub pointing to the parent copy of the deduplicated data with the second CRC seed further includes storing at least one of a plurality of stubs for each of an available plurality of CRC seeds used for each type of a plurality of available deduplication processes.

9. A system for differentiating between data and stubs pointing to a parent copy of deduplicated data, comprising:
   at least one processor device operable in a computing storage environment, wherein the at least one processor device:
      stores undeduplicated data with a checksum of an initial value as a first cyclic redundancy check (CRC) seed, and
      stores a stub pointing to the parent copy of the deduplicated data with an additional checksum of a differing, additional value as a second CRC seed.

10. The system of claim 9, wherein the at least one processor device, pursuant to conducting a subsequent input/output (I/O) operation, utilizes the first and second CRC seeds to differentiate between the undeduplicated data and the stub by comparing the stored checksum and additional checksum with a calculated checksum.

11. The system of claim 10, wherein the at least one processor device performs, on data unknown to be deduplicated or undeduplicated, a CRC check using one of the first and second CRC seeds to obtain the calculated checksum.

12. The system of claim 11, wherein the at least one processor device, subsequent to performing the CRC check, if the calculated checksum matches a predetermined assumption of the unknown data, proceeds with an input/output (I/O) operation.

13. The system of claim 12, wherein the at least one processor device, subsequent to performing the CRC check, if the calculated checksum does not match the predetermined assumption of the unknown data, performs an additional CRC check using another one of the first and second CRC seeds to obtain an additional calculated checksum.

14. The system of claim 13, wherein the at least one processor device, subsequent to performing the additional CRC check, if the additional calculated checksum matches the predetermined assumption of the unknown data, proceeds with the I/O operation.

15. The system of claim 9, wherein the at least one processor device, pursuant to storing the undeduplicated data with the first CRC seed, and storing the stub pointing to the parent copy of the deduplicated data with the second CRC seed, stores the first and second CRC seeds with one of differing numerical values and differing CRC polynomials.

16. The system of claim 9, wherein the at least one processor device stores the stub pointing to the parent copy of the deduplicated data with the second CRC seed includes storing at least one of a plurality of stubs for each of an available plurality of second CRC seeds used for each type of a plurality of available deduplication processes.

17. A computer program product for differentiating between data and stubs pointing to a parent copy of deduplicated data using a processor device, the computer program product comprising a non-transitory machine-readable storage medium having machine-readable program code portions stored therein, the machine-readable program code portions comprising:
   a first executable portion that stores undeduplicated data with a checksum of an initial value as a first cyclic redundancy check (CRC) seed; and
   a second executable portion for storing a stub pointing to the parent copy of the deduplicated data with an additional checksum of a differing, additional initial value as a second CRC seed.

18. The computer program product of claim 17, further including a third executable portion that, pursuant to conducting a subsequent input/output (I/O) operation, utilizes the first and second CRC seeds to differentiate between the undeduplicated data and the stub by comparing the stored checksum and additional checksum with a calculated checksum.

19. The computer program product of claim 18, further including a fourth executable portion that performs, on data unknown to be deduplicated or undeduplicated, a CRC check using one of the first and second CRC seeds to obtain the calculated checksum.

20. The computer program product of claim 19, further including a fifth executable portion that, subsequent to performing the CRC check, if the calculated checksum matches a predetermined assumption of the unknown data, proceeds with an input/output (I/O) operation.

21. The computer program product of claim 20, further including a sixth executable portion that, subsequent to performing the CRC check, if the calculated checksum does not match the predetermined assumption of the unknown data, performs an additional CRC check using another one of the first and second CRC seeds to obtain an additional calculated checksum.

22. The computer program product of claim 21, further including a seventh executable portion that, subsequent to performing the additional CRC check, if the additional calculated checksum matches the predetermined assumption of the unknown data, proceeds with the I/O operation.

23. The computer program product of claim 17, further including a third executable portion that, pursuant to storing the undeduplicated data with the first CRC seed, and storing the stub pointing to the parent copy of the deduplicated data with the second CRC seed, stores the first and second CRC seeds with one of differing numerical values and differing CRC polynomials.

24. The computer program product of claim 17, further including a third executable portion that stores the stub pointing to the parent copy of the deduplicated data with the second CRC seed includes storing at least one of a plurality of stubs for each of an available plurality of second CRC seeds used for each type of a plurality of available deduplication processes.

* * * * *